United States Patent
Wagner et al.

[19]

[11] Patent Number: 6,093,625
[45] Date of Patent: Jul. 25, 2000

[54] APPARATUS FOR AND METHODS OF IMPLANTING DESIRED CHEMICAL SPECIES IN SEMICONDUCTOR SUBSTRATES

[75] Inventors: Dennis W. Wagner, Austin, Tex.; Michael T. Wauk, II, West Sussex, United Kingdom; Matthew D. Scotney Castle, Austin, Tex.; Babak Adibi, Santa Clara, Calif.

[73] Assignee: Applied Materials, Inc., Santa Clara, Calif.

[21] Appl. No.: 09/081,517

[22] Filed: May 20, 1998

[30] Foreign Application Priority Data

May 20, 1997 [GB] United Kingdom .................... 9710381

[51] Int. Cl.[7] .................................................. H01L 21/425
[52] U.S. Cl. ...................................... 438/514; 250/492.21
[58] Field of Search ........................... 250/492.2, 492.21, 250/441.11; 118/723 R; 156/345; 134/1.1; 438/514, 515

[56] References Cited

U.S. PATENT DOCUMENTS

| | | | |
|---|---|---|---|
| 4,512,812 | 4/1985 | Liebert et al. | 134/21 |
| 5,308,989 | 5/1994 | Brubaker | 250/441.11 |
| 5,312,519 | 5/1994 | Sakai et al. | 134/1.1 |
| 5,354,698 | 10/1994 | Cathey, Jr. | 438/514 |
| 5,466,942 | 11/1995 | Sakai et al. | 250/492.2 |
| 5,554,854 | 9/1996 | Blake | 250/492.2 |
| 5,633,506 | 5/1997 | Blake | 250/492.2 |

FOREIGN PATENT DOCUMENTS

| | | |
|---|---|---|
| 0385709A2 | 9/1990 | European Pat. Off. . |
| 0474108A1 | 3/1992 | European Pat. Off. . |
| 0762469A1 | 3/1997 | European Pat. Off. . |

OTHER PUBLICATIONS

J. Deleu et al., "The behaviour of Si and $CoSi_2$ during low energy nitrogen bombardment, with and without $O_2$ –flooding, " Nuclear Instruments and Methods on Physics Research, B 113 (1996) pp. 537–538.

*Primary Examiner*—Thi Dang
*Attorney, Agent, or Firm*—Boult Wade Tennant

[57] ABSTRACT

An apparatus and method for implanting a desired chemical species in a semiconductor substrate. The apparatus comprises a target chamber, a holder to hold a substrate in the target chamber for implantation, a pump to pump the target chamber down to a desired pressure, a pressure lock to enable a substrate to be passed into the target chamber for loading on the holder while the target chamber is at sub-atmospheric pressure, an ion beam generator for generating and directing a beam of ions containing said desired species at a surface of a substrate on said holder, and a reactive gas supply to feed a reactive gas into the target chamber while the chamber is maintained by the pump at the desired pressure, to provide a desired partial pressure of the reactive gas in the target chamber to reactive with and volatilise unwanted contaminants on surfaces in the target chamber.

19 Claims, 1 Drawing Sheet

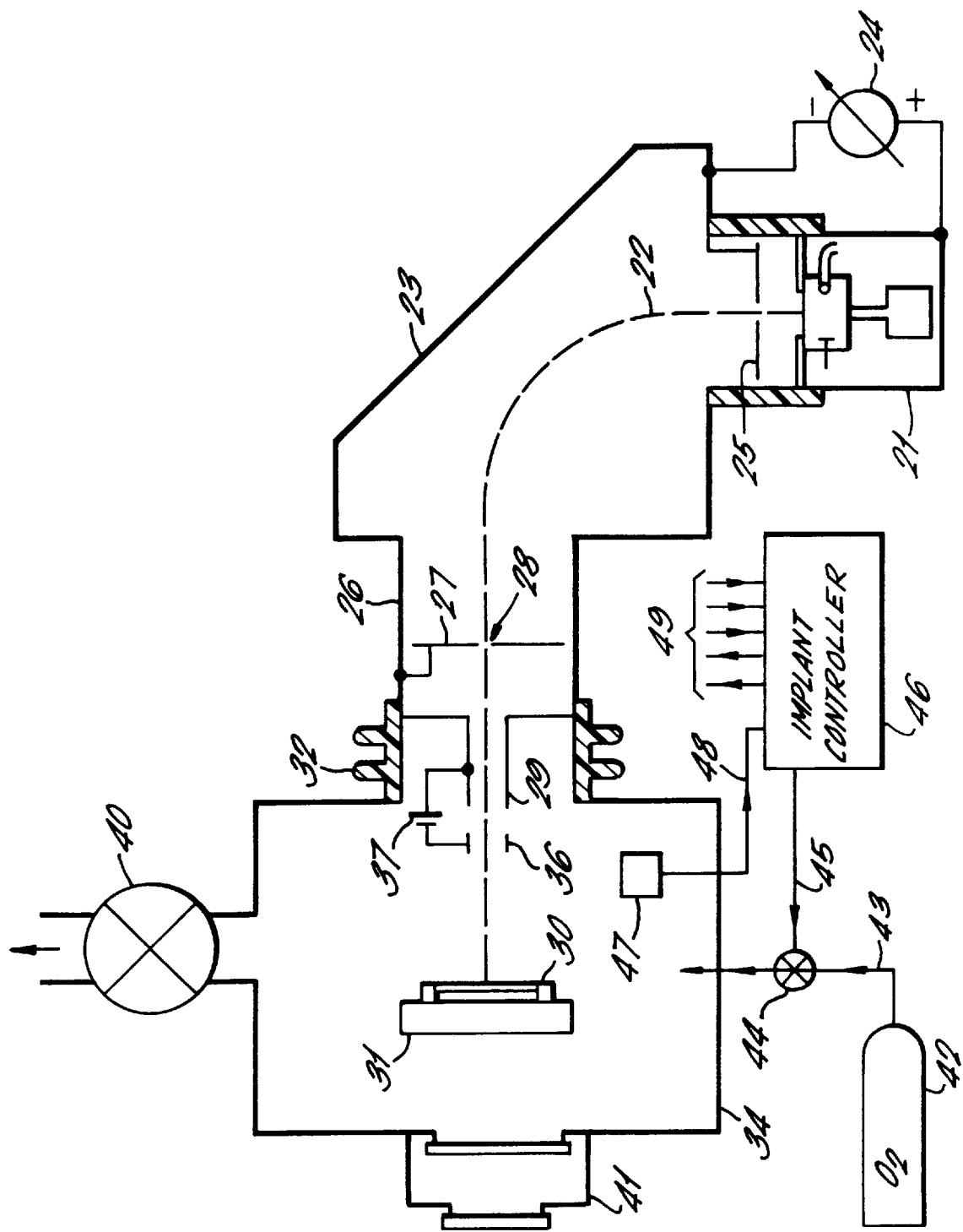

APPARATUS FOR AND METHODS OF IMPLANTING DESIRED CHEMICAL SPECIES IN SEMICONDUCTOR SUBSTRATES

FIELD OF THE INVENTION

The present invention is concerned with implanting desired chemical species in semiconductor substrates, particularly using a beam of ions containing the desired species.

DISCUSSION OF THE PRIOR ART

Ion implantation is a well established technology used for introducing desired levels of dopant species into surface and subsurface layers of a semiconductor substrate. Although this technology is well established and refined to a considerable degree, there is continuing pressure on the technology to improve performance, e.g. by forming thinner and shallower layers (using low energy ions), and to reduce contamination of the substrate by unwanted chemical species.

Ion implantation is conducted in an evacuated chamber containing the substrate to be implanted. An ion beam containing the desired species and at the desired implant energy is directed at the substrate. Contamination of the substrate can arise from the presence of other substances in the atmosphere in the target chamber of the implantation apparatus such as products of evaporation or sublimation from the materials used in the target chamber. Such materials may also be scattered from surfaces within the target chamber on which the ion beam impinges and thereby become deposited on the substrate.

In addition, problems can arise due to cross contamination whereby species from a previous implantation run contaminate surfaces of the target chamber and are subsequently deposited onto a substrate during a later implantation run with another species. A particular problem of this kind arises when arsenic is implanted after a previous phosphorus implantation. Both phosphorus and arsenic are used to provide dopant of the same polarity in a semiconductor, but arsenic is used in particular applications because it has a much lower coefficient of diffusion in the substrate and so can be used where precise implant geometries are required. Even a very small proportion of phosphorus contamination of an arsenic implant results in a massive increase in the diffusion of arsenic, so that it is important to minimise phosphorus contamination in an arsenic implant run.

Another example is when implanting boron after a previous implantation run with phosphorous, where any phosphorous contamination will act as a counter-dopant in the boron implant.

Problems can also arise from any carbon contamination. Carbon molecules will be present on the surface of wafers introduced into the target chamber, as a result of previous atmospheric exposure of the wafers. Further contribution to the carbon on the wafer may come from other sources within the target chamber. The presence of carbon contamination on the substrate surface during subsequent implant steps can have deleterious effects on the performance of certain finished semiconductor devices. For example, leakage currents in silicon oxide layers used for gate insulation of MOS devices can be increased.

SUMMARY OF THE INVENTION

In one aspect, the present invention provides apparatus for implanting a desired chemical species in a semiconductor substrate comprising a target chamber, a holder to hold a substrate in the target chamber for implantation, a pump to pump the target chamber down to a desired pressure, a pressure lock to enable a substrate to be passed into the target chamber for loading on the holder while the target chamber is at sub atmospheric pressure, an ion beam generator for generating and directing a beam of ions containing said desired species at a surface of a substrate on said holder, and a reactive gas supply to feed a reactive gas into the target chamber while the chamber is maintained by the pump at the desired pressure, to provide a desired partial pressure of the reactive gas in the target chamber to react with and volatilise unwanted contaminants on surfaces in the target chamber.

The presence of an appropriate partial pressure of a reactive gas in the target chamber during or prior to implanting, but while the chamber is maintained at the low pressure suitable for implanting, can cause contaminant species in the chamber, and particularly on the surface of the substrate to react and form more volatile species which can then evaporate from the surface to disperse in the chamber.

The description "reactive gas" is used herein to mean a gas which can react with the unwanted contaminants either naturally or when stimulated by ion collisions at the contaminated surface.

In the case of carbon contamination, the presence of oxygen, for example, in the atmosphere during implantation of a desired species such as arsenic, can result in a substantial proportion of the carbon on the substrate surface reacting with the oxygen and dispersing from the surface as CO or $CO_2$ for example. The concentration of carbon on the substrate surface can thus be reduced with attendant reduction in the quantity of carbon atoms being "knocked" into the substrate during implantation.

In the case of phosphorus contamination, the presence of a reactive gas such as oxygen causes phosphorus existing at the surfaces within the chamber to form $P_2O_3$ for example which has a relatively high vapour pressure and so tends to disperse from the surface into the chamber. This process can take place prior to a subsequent implant with arsenic for example, thereby cleansing the surfaces within the target chamber to reduce the risk of phosphorus being sputtered onto the target during a subsequent arsenic implant.

Also, the clean-up reaction process may occur during bombardment of the contaminated surface with an ion beam. Such bombardment may stimulate the desired reactions. The bombardment may be provided by a beam of the next ions to be implanted or by a beam of inert ions such as $Ar^+$. The bombardment may be performed with the wafer to be implanted present or with a dummy wafer present.

By cleansing the target chamber between successive implants with different species, the same implant machine may be used for implanting different species.

Importantly, the apparatus of the invention enables a partial pressure of reactive gas to be maintained in the target chamber even though the "vacuum" within the target chamber is maintained from process application to process application by using the pressure lock to unload processed wafers and load fresh wafers. Preferably, the reactive gas supply includes a source of said gas, a conduit for said gas from the source to the target chamber and a regulator to regulate the quantity of said gas supplied by said conduit to the target chamber. Then the reactive gas supply may further include a pressure controller to control the regulator to keep the partial pressure at a desired value. The apparatus may include an implant process controller incorporating said pressure controller and arranged to control the partial pressure of the reactive gas to follow a desired profile. The pressure controller may incorporate a monitor to monitor the partial pressure of said gas in the target chamber.

The implant process controller may provide a partial pressure of the reactive gas during implantation of the desired species.

Alternatively, or as well, said implant process controller may be arranged to provide a partial pressure of the reactive gas in the target chamber after implantation with a first desired species and before implantation with a second desired species, to reduce contamination by said first species during implantation with said second species.

The reactive gas may be at least one of $O_2$, $O_3$, $H_2$, $N_2$, $NH_3$, $CH_4$, Cl, $SF_6$, $CO_2$, and air or a reactive composition thereof. $O_2$ or $H_2$ may be preferred.

The invention also provides a method of implanting a desired chemical species in a semiconductor substrate comprising holding said substrate in an evacuated target chamber, directing a beam of ions containing said desired species at a surface of said substrate, and providing a predetermined partial pressure of a reactive gas in said target chamber. The partial pressure of reactive gas may be maintained at at least $3 \times 10^{-6}$ and more preferably at least $1 \times 10^{-5}$ Torr during the implantation.

The invention also contemplates a method of implanting a desired chemical species in a semiconductor substrate comprising pumping down a target chamber to a desired pressure, introducing a predetermined partial pressure of a reactive gas into said target chamber, loading a substrate to be implanted into the target chamber through a pressure lock, and directing a beam of ions containing said desired species at a surface of said substrate.

In one arrangement, the substrate to be implanted is loaded after the reactive gas is introduced. This arrangement may be used for pre-cleaning the chamber to reduce cross contamination. Then the method may include the additional step of directing said beam of ions at a dummy target loaded in said target chamber after introducing said reactive gas and before loading said substrate to be implanted.

The reactive gas may be introduced after the target chamber is used for implanting a different chemical species, to reduce contamination by a different species during implantation of desired species.

BRIEF DESCRIPTION OF THE DRAWING

Examples of the invention will now be described with reference to the accompanying drawing which is a schematic representation of an ion implanter embodying the present invention.

DESCRIPTION OF PREFERRED EMBODIMENTS

In the drawing, an ion implanter comprises an ion source 21 from which a beam 22 of ions are extracted. The ion source 21 is mounted by insulators on the structure of a mass selection magnet 23. An extraction bias 24 biases the ion source relative to an extraction electrode 25 at the entrance to the mass selection magnet 23. The mass selection magnet 23 causes the ions in the beam 22 to travel in a curved path so that ions of the desired mass/charge ratio are focused at an electrode 27. Only ions of the desired mass/charge ratio pass through a mass selection slit 28 in the electrode 27 and hence continue along a linear beam path to impinge on the surface of a wafer 30 held in a holder 31 in the target chamber 34 of the implanter. The target chamber 34 is itself mounted by means of an insulator 32 on a flight tube 26.

The target chamber 34 is pumped down by a vacuum pump 40 and maintained at a low pressure suitable for implantation. Generally, the substrate 30 on its holder 31 is maintained at substantially the same potential as the walls of the target chamber 34, typically at ground. The potential difference between the flight tube 26 and the wafer 30 depends on the desired implantation energy of the ions in the beam 22. If the wafer 30 is at a positive potential relative to the flight tube 26, then ions are decelerated after mass selection to a lower implantation energy compared to the energy of extraction from the ion source 21. If the wafer 30 is at a negative potential relative to the flight tube 26, then the ions are accelerated after mass selection to a higher implant energy.

Particularly, in the case of post mass selection deceleration, an electron supression electrode 36 may be provided at a negative potential relative to the flight tube 26 to prevent beam neutralising electrons from being drawn out of the beam within the flight tube.

The target chamber 34 includes a pressure lock 41 which enables wafers to be unloaded and loaded on the holder 31 in the target chamber while maintaining the target chamber at sub-atmospheric pressure. Thus, there is no need to open the target chamber 34 to atmosphere between processing operations and the pump 40 can be operated to keep the target chamber at a low sub-atmospheric pressure during unloading and reloading of the holder 31.

A source 42 of reactive gas, here shown as $O_2$ by way of example only, can be supplied to the chamber 34 along a conduit 43. The supply of gas to the chamber 34 along the conduit 33 is regulated by a regulator 44 controlled by signals on a line 45 from an implant controller 46. A gas pressure sensor 47 is provided in the target chamber 34 to generate a signal on a line 48 which can represent the partial pressure in the chamber 34 of the reactive gas from the source 42. The implant controller 46 controls many functions of the implanter illustrated receiving signals from sensors and supplying control signals to the implanter on various lines shown generally at 49.

In a first example, the implanter illustrated in the drawing can be operated to reduce the amount of phosphorus contamination occurring in a subsequent arsenic implant. A first wafer to be processed is loaded via the pressure lock 41 onto the holder 31. The implanter is then operated to direct a beam of phosphorus ions at the wafer 30, the phosphorus implantation process is controlled to produce the desired concentration and depth profile of phosphorus atoms in the substrate.

During this implantation procedure, the regulator 44 may be switched off, preventing oxygen from entering the target chamber 34. The pump 40 is operated to maintain the target chamber at a desired low process pressure.

During the phosphorus implantation process, some phosphorus ions will impinge on surfaces within the target chamber other than the wafer 30 itself, so that by the end of the implant run, these surfaces can have a coating of phosphorus atoms. Not only surfaces directly in the line of the phosphorus ion beam can become coated, but also phosphorus ions or atoms sputtered from the wafer or resulting from collisions with residual gas in the chamber 34 can condense onto other surfaces within the chamber.

Once the phosphorus implantation run is completed, the processed wafer is removed from the chamber via the pressure lock 41 and replaced by a dummy wafer on the holder 31. During this time, the pump 40 continues to maintain a low pressure in the target chamber 34.

The ion source 21 may now be adjusted to provide a supply of arsenic ions in the beam 22 and these arsenic ions emerge through the mass selection slit 28 to impinge upon the dummy wafer and surrounding surfaces of the holder. During this dummy implant run, the regulator 44 is controlled by the implant controller 46 to bleed sufficient oxygen from the source 42 to maintain a desired partial pressure of oxygen within the chamber 34 as measured by the sensor 47. The presence of oxygen in the chamber encourages the reaction of phosphorus atoms coating surfaces within the chamber to produce phosphorus oxides which, having a higher vapour pressure are more volatile and tend to evaporate from the surfaces into the atmosphere in the chamber 34 whence they can be pumped out by the pump 40. The presence of the arsenic beam during this "cleaning" process is not essential but may assist in cleaning especially those surfaces of the holder 31 and within the target chamber 34 which are irradiated by the arsenic beam. Instead of arsenic an $Ar^+$ beam may be used.

After the dummy implantation run, the arsenic beam is turned off whilst the dummy wafer is removed through the pressure lock 41 and replaced with a new process wafer in which an arsenic implant is to be made. The arsenic beam is then turned on again to perform the implantation run. During the implantation run on the processed wafer, the oxygen bleed from the source 42 may be turned off again.

Instead of providing a dummy implant of arsenic ions (on a dummy wafer) with the partial pressure of oxygen present in the target chamber 34, considerable reduction in phosphorus contamination can be achieved by providing some oxygen bleed into the chamber 34 for some period during the final stages of the previous phosphorus implantation run, and the early stages of the subsequent arsenic implantation run. In fact an oxygen bleed providing an appropriate oxygen partial pressure within the target chamber 34 may be continued throughout the implantation runs.

Useful results are obtained with oxygen partial pressure of at least $3 \times 10^{-6}$ and preferably $1 \times 10^{-5}$ Torr in a target chamber pressure of between $1 \times 10^{-5}$ Torr and $1 \times 10^{-4}$ Torr.

Instead of oxygen a partial pressure of hydrogen may be provided to produce volatile $PH_3$ for example.

In a second example involving the reduction of carbon contamination, arsenic is implanted into a wafer and throughout the implantation run, air is bled into the target chamber 34 to provide a controlled partial pressure of air. The concentration of carbon atoms on the surface of the substrate was measured by SIMS analysis for different partial pressures of air in the chamber 34.

In a test case with no air bleed, the partial pressure of residual air in the chamber 34 was measured at about $5 \times 10^{-7}$ Torr for a process chamber pressure of about $1.7 \times 10^{-5}$. A carbon concentration on the substrate surface was measured at about $2.11 \times 10^{14}$ per sq.cm.

For an air bleed providing a partial pressure of air of $1.3 \times 10^{-5}$ in the chamber 34 during implantation, with the chamber pressure then being $3 \times 10^{-5}$, the concentration of carbon on the surface of the substrate is reduced to $7.87 \times 10^{13}$ per sq.cm. Increasing the partial pressure of room air to $8.3 \times 10^5$ reduces the carbon concentration further to about $6.29 \times 10^{13}$ per sq.cm.

Apart from the above examples, the described procedure of introducing a reactive gas into the target chamber during or immediately before implantation can have advantages in a number of processes. $H_2$ may be used as the reactive gas to remove F atoms through the formation of HF, in shallow surface regions.

$H_2$ may be used also to remove partial native silicon oxide layers which otherwise would interfere with the uniform implantation of very low energy dopants below 5 kV energy.

Other reative gases which may be contemplated are $O_3$, $N_2$, $NH_3$, $CH_4$, $CO_2$, Cl and $SF_6$.

Where $O_2$ or an oxygen rich gas such as air is bled into the process chamber during implantation onto areas of bare silicon on wafers being processed, a continuous thin oxide film can be formed over the silicon areas at the end of the implant. This may be useful in providing passivation of the surface of the wafer upon subsequent exposure to atmosphere, and also provides a cap to prevent out diffusion of dopants from the silicon at room temperature and during the initial stages of annealing.

What is claimed is:

1. Apparatus for implanting a desired chemical species in a semiconductor substrate comprising a target chamber, a holder to hold a substrate in the target chamber for implantation, a pump to pump the target chamber down to a desired pressure, a pressure lock to enable a substrate to be passed into the target chamber for loading on the holder while the target chamber is at sub-atmospheric pressure, an ion beam generator for generating and directing a beam of ions containing said desired species at a surface of a substrate on said holder, and a reactive gas supply to feed a reactive gas into the target chamber while the chamber is maintained by the pump at the desired pressure, to provide a desired partial pressure of the reactive gas in the target chamber to react with and volatilise unwanted contaminants on surfaces in the target chamber.

2. Apparatus as claimed in claim 1, wherein the reactive gas supply includes a source of said gas, a conduit for said gas from the source to the target chamber, and a regulator to regulate the quantity of said gas supplied by said conduit to the target chamber.

3. Apparatus as claimed in claim 2, wherein the reactive gas supply further includes a pressure controller to control the regulator to keep the partial pressure at a desired value.

4. Apparatus as claimed in claim 3, including an implant process controller incorporating said pressure controller and arranged to control the partial pressure of the reactive gas to follow a desired profile.

5. Apparatus as claimed in claim 4, wherein said implant process controller is arranged to provide a partial pressure of the reactive gas during implantation of the desired species into a substrate.

6. Apparatus as claimed in claim 4, wherein said implant process controller is arranged to provide a partial pressure of the reactive gas in the target chamber after implantation with a first desired species and before implantation with a second desired species, to reduce contamination by said first species during implantation with said second species.

7. Apparatus as claimed in claim 1, wherein the ion beam generator provides a beam of ions comprising any one or a combination of $AS^+$, $P^+$, $BF_2^+$, $Sb^+$, $B^+$, $Ge^+$, $Si^+$.

8. Apparatus as claimed in claim 1, wherein the reactive gas supply provides a supply of gas comprising at least one of $O_2$, $O_3$, $H_2$, $N_2$, $NH_3$, $CH_4$, Cl, $SF_6$, $CO_2$, and air or a reactive composition thereof.

9. A method of implanting a desired chemical species in a semiconductor substrate comprising holding said substrate in an evacuated target chamber, directing a beam of ions containing said desired species at a surface of said substrate, and providing a predetermined partial pressure of a reactive gas in said target chamber.

10. A method as claimed in claim 9 wherein the partial pressure of reactive gas is maintained at at least $3 \times 10^{-6}$ Torr during the implantation.

11. A method as claimed in claim 9, wherein the reactive gas is at least one of $O_2$, $O_3$, $H_2$, $N_2$, $NH_3$, $CH_4$, Cl, $SF_6$, $CO_2$, and air or a reactive composition thereof.

12. A method of implanting a desired chemical species in a semiconductor substrate comprising pumping down a target chamber to a desired pressure, introducing a predetermined partial pressure of a reactive gas into said target chamber, loading a substrate to be implanted into the target chamber through a pressure lock, and directing a beam of ions containing said desired species at a surface of said substrate.

13. A method as claimed in claim 12, wherein the substrate to be implanted is loaded after the reactive gas is introduced.

14. A method as claimed in claim 13 comprising an additional step of directing said beam of ions at a dummy target loaded in said target chamber after introducing said reactive gas and before loading said substrate to be implanted.

15. A method as claimed in claim 12, wherein said desired species to be implanted is arsenic.

16. A method as claimed in claim 12, wherein the reactive gas is introduced after the target chamber is used for implanting a different chemical species, to reduce contamination by said different species during implantation of said desired species.

17. A method as claimed in claim 16, wherein said different species is phosphorus.

18. A method as claimed in claim 12, wherein the reactive gas comprises at least one of $O_2$, $O_3$, $H_2$, $N_2$, $NH_3$, $CH_4$, Cl, $SF_6$, $CO_2$, and air or a reactive composition thereof.

19. A method as claimed in claim 12, wherein said partial pressure of reactive gas in the target chamber is at least $3 \times 10^{-6}$ Torr, up to the start of implanting said desired species in said substrate.

* * * * *